(12) United States Patent
Sakino et al.

(10) Patent No.: US 7,443,619 B2
(45) Date of Patent: Oct. 28, 2008

(54) OPTICAL ELEMENT HOLDING APPARATUS, EXPOSURE APPARATUS AND DEVICE MANUFACTURING METHOD

(75) Inventors: Shigeo Sakino, Higashimurayama (JP); Hirohito Ito, Utsunomiya (JP); Shinji Uchida, Utsunomiya (JP); Choshoku Sai, Utsunomiya (JP); Katsumi Asada, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/532,957

(22) Filed: Sep. 19, 2006

(65) Prior Publication Data

US 2007/0076310 A1 Apr. 5, 2007

(30) Foreign Application Priority Data

Oct. 4, 2005 (JP) ............................ 2005-291295

(51) Int. Cl.
*G02B 7/02* (2006.01)
*G02B 7/182* (2006.01)

(52) U.S. Cl. ...................................... 359/819; 359/872

(58) Field of Classification Search ......... 359/290–292, 359/295, 298, 220, 223–224
See application file for complete search history.

(56) References Cited

U.S. PATENT DOCUMENTS

| 4,408,874 | A | | 10/1983 | Zinky et al. | |
|---|---|---|---|---|---|
| 4,655,563 | A | * | 4/1987 | Plante et al. | 359/849 |
| 4,875,764 | A | * | 10/1989 | Marino et al. | 359/849 |
| 4,875,765 | A | * | 10/1989 | Vandenberg et al. | 359/849 |
| 4,993,823 | A | * | 2/1991 | Schaffer et al. | 359/849 |
| 6,765,712 | B2 | * | 7/2004 | Van Dijsseldonk et al. | 359/291 |
| 6,840,638 | B2 | * | 1/2005 | Watson | 359/849 |
| 7,009,752 | B1 | * | 3/2006 | Lorell et al. | 359/290 |
| 7,116,500 | B2 | * | 10/2006 | Murasato | 359/819 |
| 2002/0101646 | A1 | * | 8/2002 | Ide et al. | 359/295 |
| 2003/0197914 | A1 | * | 10/2003 | Cox et al. | 359/223 |
| 2004/0027632 | A1 | * | 2/2004 | Watson | 359/223 |
| 2004/0144915 | A1 | | 7/2004 | Wagner et al. | |

FOREIGN PATENT DOCUMENTS

| JP | 58-033255 A | 2/1983 |
|---|---|---|
| JP | 2000-031039 A | 1/2000 |
| JP | 2003-203860 A | 7/2003 |

* cited by examiner

*Primary Examiner*—Scott J Sugarman
*Assistant Examiner*—Dawayne A Pinkney
(74) *Attorney, Agent, or Firm*—Canon U.S.A., Inc. I.P. Division

(57) ABSTRACT

At least one exemplary embodiment is directed to an optical element holding apparatus including a force generating actuator configured to deform the optical element, a measuring device configured to measure a position of the optical element, and a displacement causing actuator configured to position the optical element based on the measured position.

8 Claims, 4 Drawing Sheets

OPTICAL ELEMENT HOLDING APPARATUS, EXPOSURE APPARATUS AND DEVICE MANUFACTURING METHOD

BACKGROUND OF THE INVENTION

1. Field of the Invention

The present invention relates to an optical element holding apparatus, an exposure apparatus including the optical element holding apparatus, and a device manufacturing method using the exposure apparatus.

2. Description of the Related Art

An exposure apparatus can be used in a manufacturing process of a semiconductor element or other device. As discussed in Japanese Patent Application Laid-open No. 58-033255 (corresponding to U.S. Pat. No. 4,408,874), a conventional mechanism for deforming a mirror can be used to correct the astigmatism of the mirror when caused by the exposure.

Furthermore, as discussed in Japanese Patent Application Laid-open No. 2000-031039 (corresponding to U.S. Patent Application Publication No. US 2004/0144915 A1), there is another conventional method for not only deforming a mirror but also correcting a rigid-body position of the mirror in six degrees of freedom.

The system discussed in Japanese Patent Application Laid-open No. 2000-031039 includes a rigid-body servo mechanism equipped with at least three force actuators and a mirror deforming mechanism equipped with plural force actuators having no servo mechanism.

Furthermore, as discussed in Japanese Patent Application Laid-open No. 2003-203860 (corresponding to U.S. Patent Application Publication No. US 2003/0197914 A1), a force exerted between a reaction mass and an optical element can be used to adjust the position of an optical element in multiple degrees of freedom.

The system discussed in Japanese Patent Application Laid-open No. 2003-203860 further includes a correction mechanism for correcting local mirror surface imperfections (local defects or imperfections of the mirror surface), which includes a plurality of local position control loops constituted by sensors and actuators.

However, the technique discussed in Japanese Patent Application Laid-open No. 2000-031039 has the following features.

(1) Both the deforming actuators and the rigid-body position correcting actuators are force actuators having lower rigidity. Therefore, if a disturbance of lower-frequency vibrations is applied on the mirror, a large positional deviation will arise and the accuracy will deteriorate.

(2) As the actuators are required to support the gravity of a mirror, a great amount of heat is generated in the actuators.

On the other hand, the technique discussed in Japanese Patent Application Laid-open No. 2003-203860 requires plural local position control loops constituted by numerous sensors and actuators for correcting local deformations of the mirror and accordingly has the following feature.

(1) A number of position sensors are required, which corresponds to deforming actuators. Therefore, the system arrangement is complicated and causes an increase in cost.

SUMMARY OF THE INVENTION

At least one exemplary embodiment of the present invention is directed to a novel and useful technique capable of deforming, positioning and holding an optical element.

According to an aspect of the present invention, at least one exemplary embodiment is directed to an optical element holding apparatus, including: a force generating actuator configured to deform the optical element; a measuring device configured to measure a position of the optical element in a rigid-body motion mode; and a displacement causing actuator configured to adjust a position of the optical element based on the measured position.

According to an aspect of the present invention, at least one exemplary embodiment is directed to an exposure apparatus configured to expose a substrate to light via an optical system and an original plate. The exposure apparatus includes the above-described optical element holding apparatus, where the optical element holding apparatus holds at least one optical element in the optical system.

According to an aspect of the present invention, at least one exemplary embodiment is directed to a method of manufacturing a device. The method includes the steps of: exposing a substrate to light via an optical system and a reticle using the above-described exposure apparatus; developing the exposed substrate; and processing the developed substrate to manufacture the device.

Further features of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments of the invention and, together with the description, serve to explain at least a few of the principles of the invention.

DETAILED DESCRIPTION OF THE EMBODIMENTS

Figure 1:
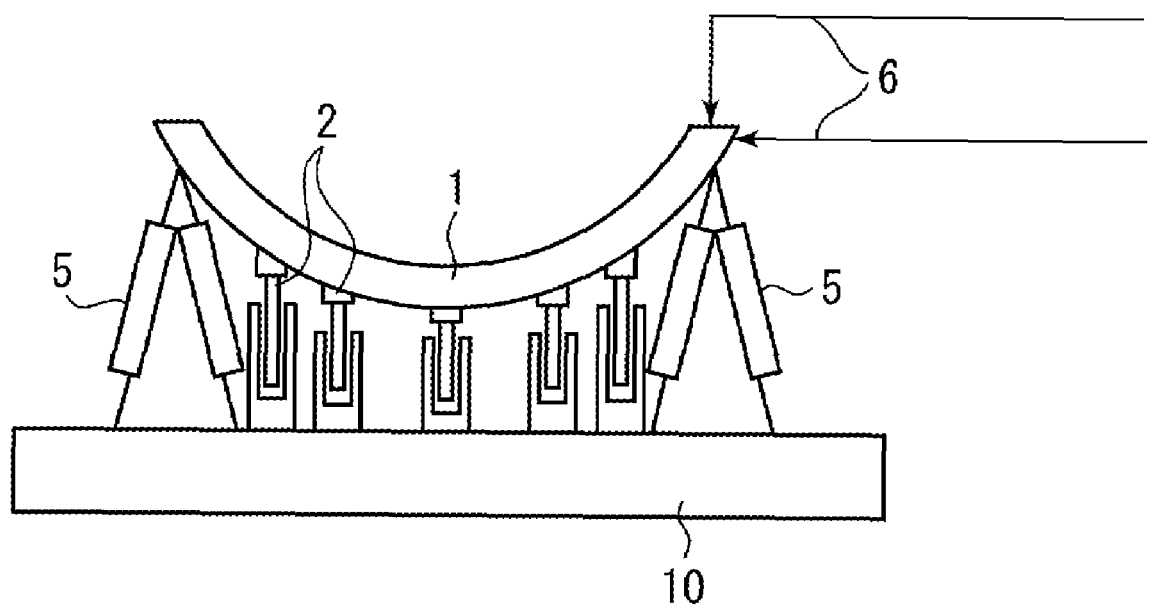
FIG. 1 is a view illustrating an optical element holding apparatus in accordance with a first exemplary embodiment.

The following description of exemplary embodiments is merely illustrative in nature and is in no way intended to limit the invention, its application, or uses.

Processes, techniques, apparatus, and materials as known by one of ordinary skill in the art may not be discussed in detail but are intended to be part of the enabling description where appropriate. Note that herein when referring to correcting or corrections of an error (e.g., correction of an astigmatism or correction of a position), a reduction of the error and/or a correction of the error is intended.

It is noted that throughout the specification, similar reference numerals and letters refer to similar items in the following figures, and thus once an item is defined in one figure, it may not be discussed for following figures.

Exemplary embodiments will be described in detail below with reference to the drawings.

First Exemplary Embodiment

FIG. 1 is a view illustrating a schematic arrangement of an optical element holding apparatus in accordance with a first exemplary embodiment.

An exemplary arrangement shown in FIG. 1 includes a deformable optical element 1, a force generating actuator 2, which can have multiple actuators (e.g., 2a, . . . ) that can deform the optical element 1, an optical element holding member 10 having a reference surface, a displacement causing actuator 5, which can have multiple actuators (e.g., 5a, . . . ) having a correction function that can adjust the position of the optical element 1 in a rigid-body motion mode, and a measuring unit 6, which can have multiple measuring units (e.g., 6a, . . . ) that can measure the position of the optical element 1 in the rigid-body motion mode. The displacement causing actuator 5 is, for example, a piezoelectric element or a parallel link mechanism using piezoelectric elements.

According to the above-described arrangement, plural actuators 2a, . . . attached on the reference surface of the optical element holding member 10 can cooperatively deform the optical element 1 into a desired shape (i.e., a predetermined shape).

Furthermore, based on measurement result obtained by the measuring unit 6 with respect to the position of the optical element 1 in the rigid-body motion mode, plural displacement causing actuators 5a, . . . attached on the reference surface of the optical element holding member 10 can cooperatively correct the position of the optical element 1.

The measuring unit 6 shown in FIG. 1 can have two measurement directions corresponding to two axes. However, an appropriate number of measurement directions can be selected from 6 axes of X, Y, Z, θx, θy, and θz.

Furthermore, the force generating actuator 2 can perform the control based on the measurement result of a force sensor (not shown), or perform the control so that an output current of the driver of the force generating actuator 2 becomes a predetermined value.

The above-described optical element holding apparatus according to the first exemplary embodiment can deform an optical element and can correct the astigmatism of the optical element when caused by the exposure, or can correct a deviation of the surface shape compared to an ideal shape of the optical element.

Furthermore, the optical element holding apparatus according to the first exemplary embodiment requires the force generating actuators used in the optical element deforming mechanism. Moreover, the optical element holding apparatus according to the first exemplary embodiment measures the position of the optical element in the (six-degree freedom) rigid-body motion mode, and controls the displacement causing actuators to adjust the position of the optical element based on the measurement result.

The exemplary arrangement of the first exemplary embodiment can have the following features.

(1) The exemplary arrangement of the first exemplary embodiment can accurately deform an optical element and can accurately shift and hold the optical element to and at a position, without requiring a complicated control system including numerous sensors.

(2) The exemplary arrangement of the first exemplary embodiment requires no leaf spring or other mechanical member for holding an optical element, and accordingly can suppress unnecessary deformation of the optical element and can reduce the positional deviation caused.

(3) The exemplary arrangement of the first exemplary embodiment can use the displacement causing actuators for positioning an optical element in the rigid-body motion mode, and therefore can accurately shift and hold the optical element even when a disturbance of 20 Hz or lower-frequency vibrations is applied on the optical element.

For example, a piezoelectric element or a parallel link mechanism including piezoelectric elements can be employed for positioning an optical element in the rigid-body motion mode, because the piezoelectric element or the parallel link mechanism including piezoelectric elements has higher rigidity and robustness against disturbance vibrations in the lower frequency region.

(4) The exemplary arrangement of the first exemplary embodiment can use the non-contact type force generating actuators to deform an optical element, which can effectively absorb high-frequency vibrations (especially, the vibrations exceeding 20 Hz) entering from the outside, and accordingly can accurately shift and hold the optical element to and at a position.

(5) The exemplary arrangement of the first exemplary embodiment can measure a force generated by the deformation force generating actuators and can feedback control the shape of an optical element accurately without measuring an actual deformation (shape) of the optical element.

(6) The exemplary arrangement of the first exemplary embodiment can measure the current supplied to the deformation force generating actuators and can feedback control the current to a constant value, and therefore can accurately control the shape of an optical element with a simple and low-priced arrangement.

(7) The exemplary arrangement of the first exemplary embodiment can dispose the optical element deforming actuators (force generating actuators) in parallel with the rigid-body motion mode positioning actuators (displacement causing actuators), and accordingly can reduce the total height of the system. Furthermore, the adjustment and assembling work can be easily performed when these actuators are mounted on the same surface.

(8) The exemplary arrangement of the first exemplary embodiment can realize a simplified arrangement capable of accurately deforming an optical element into a shape and accurately positioning the optical element to a position in the rigid-body motion mode.

(9) The exemplary arrangement of the first exemplary embodiment can utilize a compensating function of the piezoelectric element that can compensate the gravity of an optical element, when a piezoelectric element or a parallel link mechanism using piezoelectric elements is employed for positioning the optical element to a position in a rigid-body motion mode.

Second Exemplary Embodiment

Figure 2:
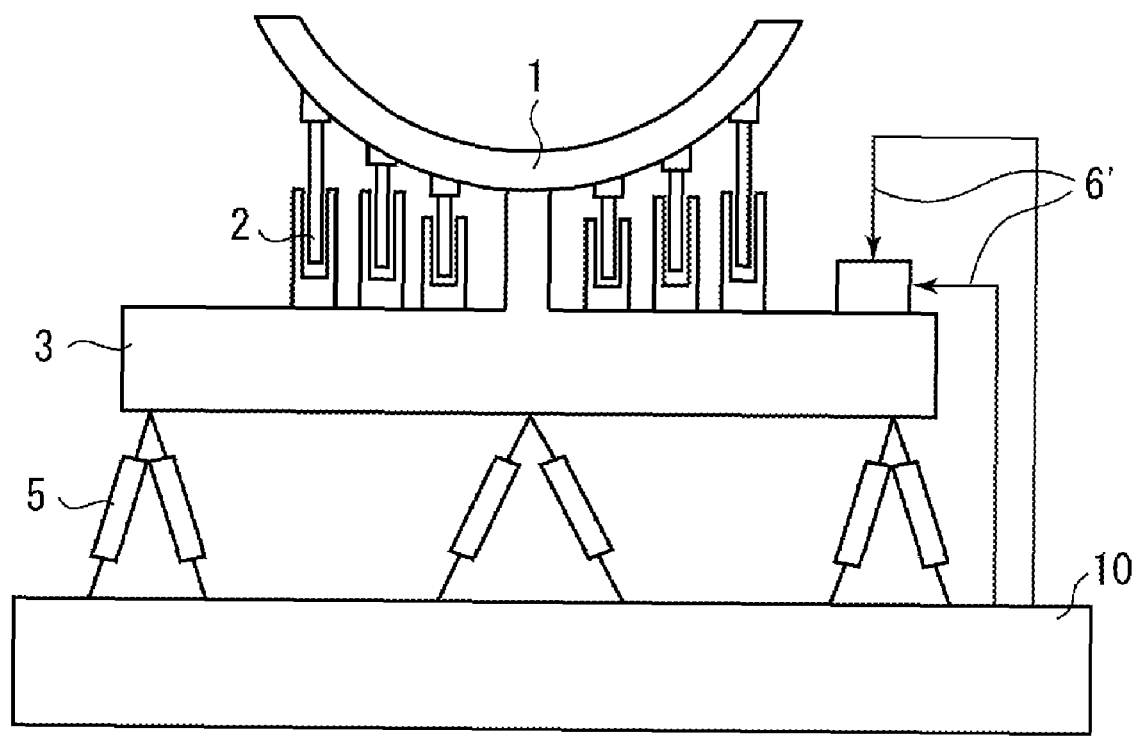
FIG. 2 is a view illustrating an optical element holding apparatus in accordance with a second exemplary embodiment.

FIG. 2 is a view illustrating an optical element holding apparatus in accordance with a second exemplary embodiment. The constituent components identical to those shown in FIG. 1 are denoted by the same reference numerals and will not be described again.

An exemplary arrangement shown in FIG. 2 includes an actuator support plate 3, via which the optical element deforming actuators 2a, . . . are disposed in series with the rigid-body motion mode positioning actuators 5a, . . . .

According to the above-described exemplary arrangement, the optical element 1 can be deformed into a desired shape by plural non-contact type force generating actuators 2a, . . . attached on the actuator support plate 3.

The actuators 2a, . . . , fixed on the actuator support plate 3, can deform the optical element 1 in a non-contact manner. Furthermore, the displacement causing actuators 5a, . . . , having the capability of positioning the optical element 1 to a position in a rigid-body motion mode, are fixed on the reference surface of the optical element holding member 10.

The displacement causing actuators 5a, . . . can cooperatively shift the support plate 3 to a predetermined position relative to the reference surface, based on the position of the support plate 3 in the rigid-body motion mode measured by the measuring unit 6', which can have multiple measuring units (e.g., 6a', . . . ).

The measuring unit 6' shown in FIG. 2 can measure the position of the support plate 3. However, the measuring unit 6 can be configured to measure the position of the optical element 1.

Furthermore, the optical element 1 can be supported on a predetermined point as shown in FIG. 2, or can be supported using a gravity compensating support, such as a permanent magnet that can magnetically support the optical element 1 in a floating condition or a pneumatic actuator having lower rigidity.

According to the above-described second exemplary embodiment, the non-contact type force generating actuators configured to deform the optical element can be disposed in series with the displacement causing actuators configured to position the optical element to a position in the rigid-body motion mode. The exemplary arrangement of the second exemplary embodiment can have the following features.

(1) The exemplary arrangement of the second exemplary embodiment can prevent and/or reduce an optical element from receiving a force generated by the rigid-body motion mode positioning actuators, and therefore can accurately shift and hold the optical element to and at a position.

(2) The exemplary arrangement of the second exemplary embodiment can use the non-contact type force actuators that can suppress disturbance vibrations transmitted to an optical element, and accordingly can accurately shift and hold the optical element to and at a position.

(3) The exemplary arrangement of the second exemplary embodiment can reduce a reaction force of the optical element deforming actuators transmitted to a reference surface along which an optical element is positioned, and therefore can accurately deform, shift, and hold the optical element to and at a position.

(4) The exemplary arrangement of the second exemplary embodiment can attenuate a disturbance of lower-frequency vibrations (lower than approximately 20 Hz) by the displacement causing actuators disposed at a lower position, and also attenuate a disturbance of higher-frequency vibrations (exceeding approximately 20 Hz) by the non-contact type force generating actuators disposed at an upper position. Therefore, the exemplary arrangement of the second exemplary embodiment can accurately deform, shift, and hold the optical element.

(5) The exemplary arrangement of the second exemplary embodiment can suppress vibrations transmitted between the holding member 10 and the optical element 1, and can accurately deform the optical element and can accurately shift and hold the optical element.

<Exemplary Arrangement of Exposure Apparatus>

Figure 3:
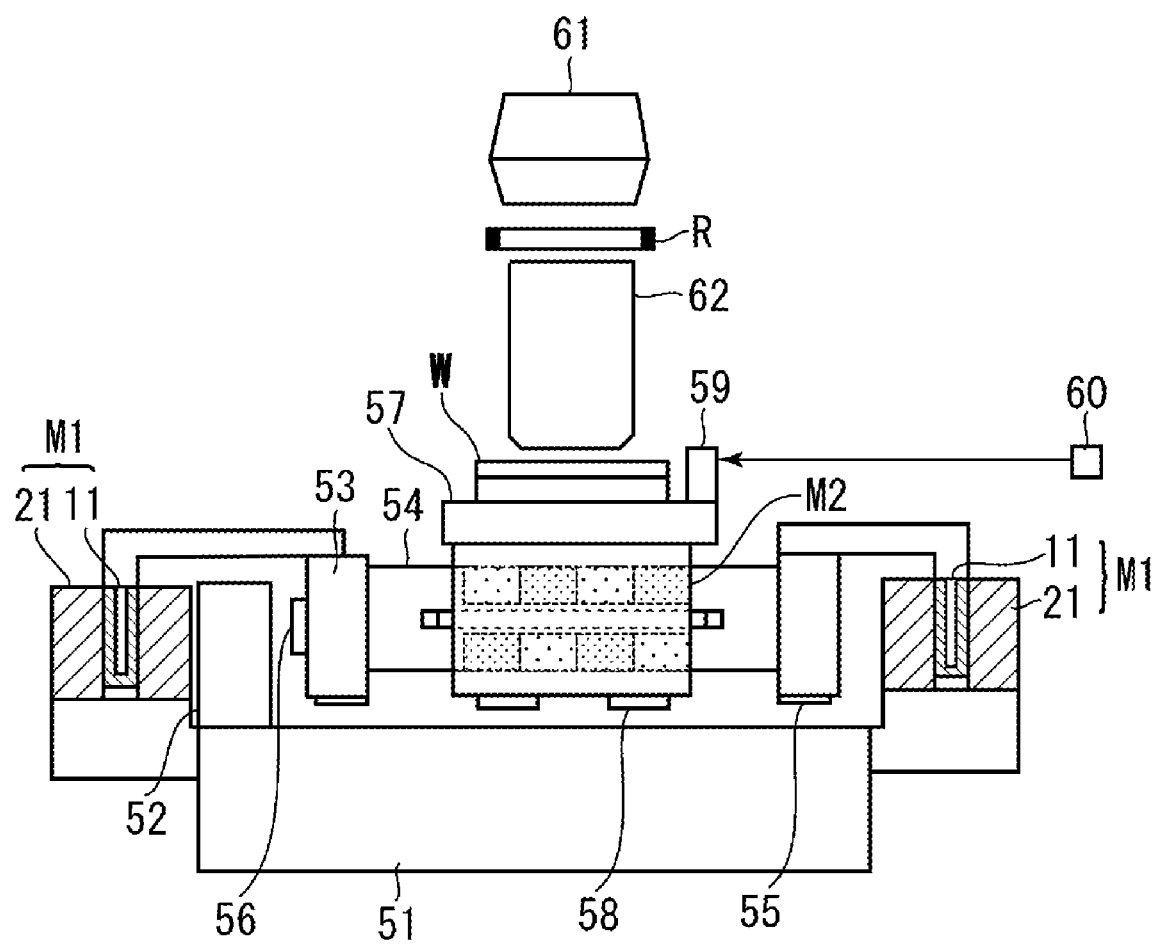
FIG. 3 is a view illustrating an exposure apparatus including the optical element holding apparatus in accordance with an exemplary embodiment.

FIG. 3 is a view illustrating an exemplary arrangement of an exposure apparatus including the above-described optical element holding apparatus in accordance with at least one exemplary embodiment.

The exposure apparatus can be used to manufacture a device having a micro pattern formed thereon, such as a semiconductor integrated circuit or other semiconductor device, a micromachine, or a thin-film magnetic head.

The exposure apparatus includes an illumination optical system 61, a reticle R (i.e., original plate), and a projection optical system 62. The exposure apparatus can transfer a desired pattern onto the substrate by irradiating a semiconductor wafer W (serving as a substrate) with exposure light (i.e., exposure energy produced from a light source).

In at least one exemplary embodiment, the "exposure light" can refer to visible light, ultraviolet light, EUV light, X ray, electron ray, and charged particle rays. Furthermore, the "optical system" is the term encompassing all of an optical system including a refraction optical element, an optical system including a reflection optical element, an optical system including both a refraction optical element and a reflection optical element, and a charged particle lens system (i.e., a system capable of generating an electric field for deflecting charged particles).

The exposure apparatus includes a guide 52 and a linear motor stator 21 fixed on a platen 51. The linear motor stator 21 includes a multi-phase electromagnetic coil, while a linear motor movable element 11 has a permanent magnet unit. The linear motor movable element 11, as a movable section 53, is connected to a movable guide 54 (i.e., a stage).

When the linear motor M1 is driven, the movable guide 54 can shift in a direction normal to the sheet of FIG. 3. The movable section 53 can be supported on the upper surface of the platen 51 via a hydrostatic bearing 55 and also supported on an inner side surface of the guide 52 via a hydrostatic bearing 56.

A shifting stage 57, i.e., a stage straddling over the movable guide 54, can be supported on the upper surface of the platen 51 via a hydrostatic bearing 58. The shifting stage 57, when driven by a linear motor M2, can move relative to the movable guide 54 in the right and left direction on the sheet of FIG. 3. A mirror 59 fixed to the shifting stage 57 and an interferometer 60 can measure a movement of the shifting stage 57.

A chuck mounted on the shifting stage 57 can hold the wafer W (i.e., substrate). Each region on the wafer W is exposed to the light emitted from the illumination optical system 61, via the projection optical system 62, and the reticle R (i.e., original plate). The projection optical system can transfer a reduced pattern of the original plate onto the wafer W using a step-and-repeat method or a step-and-scan method.

Exemplary embodiments of the present invention can be also applied to another type of exposure apparatus that can directly draw a circuit pattern on a semiconductor wafer without using any mask.

In such an exposure apparatus, the above-described optical element holding apparatus can hold at least one optical element such as a reflection optical element (e.g., mirror) in the optical system. Thus, the exposure processing can be accurately accomplished.

<Exemplary Device Manufacturing Processes>

Next, exemplary manufacturing processes of a semiconductor device using the above-described exposure apparatus will be described with reference to a flow diagram of FIG. 4.

Figure 4:
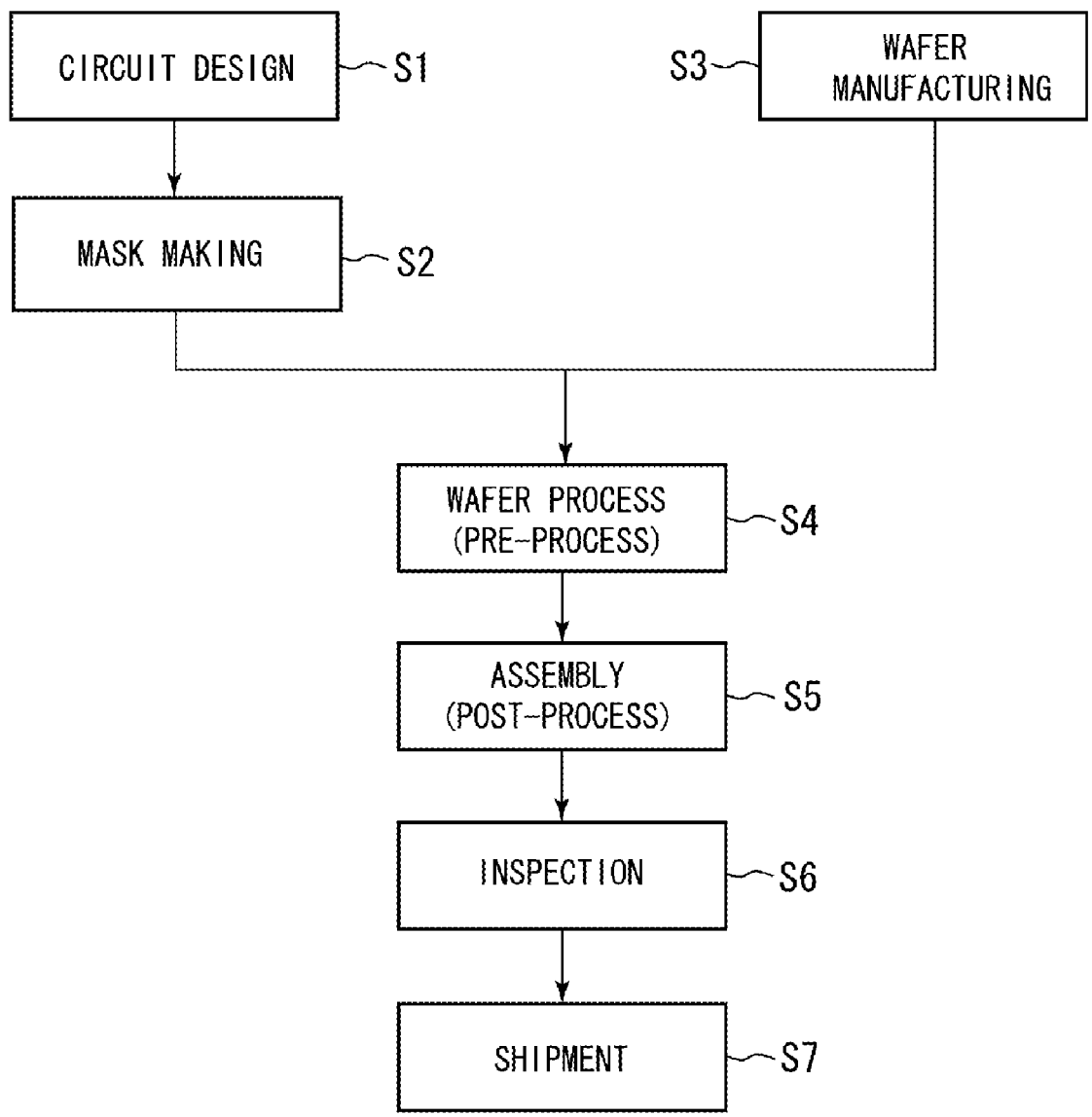
FIG. 4 is a flow diagram showing device manufacturing processes.

The exemplary device manufacturing flow of FIG. 4 includes step S1 (i.e., circuit design) for executing a circuit design of a semiconductor device, step S2 (i.e., mask making) for fabricating a mask (also referred to as original plate or reticle) based on a designed circuit pattern, step S3 (i.e., wafer manufacturing) for fabricating a wafer (substrate) from a silicon or other material, and step S4 (i.e., wafer process) serving as a pre-process. In the wafer process step S4, the exposure apparatus forms an actual circuit on the wafer with the above-described mask utilizing, for example, the lithography technique.

The exemplary device manufacturing flow of FIG. 4 further includes step S5 (assembly) serving as a post-process, step S6 (inspection), and step S7 (shipment). The assembly step S5 includes an assembly process (dicing, bonding, etc) and a packaging process (chip sealing) to form a semiconductor chip from the wafer manufactured in step S4. The inspection step S6 includes an operation check test and an endurance test applied to the semiconductor device formed in the step S5. The semiconductor device finished through the above-described steps is sent to the shipment step S7.

The wafer process step S4 can include an oxidation step of oxidizing the surface on a wafer, a CVD step of forming an insulation film on the wafer surface, an electrode forming step of forming an electrode on the wafer by vaporization, an ion implantation step of implanting ions into the wafer, a resist processing step of applying photosensitive agent to the wafer, an exposure step of exposing the resist processed wafer to the light emitted from the exposure apparatus via a reticle having a circuit pattern formed thereon, a developing step of developing the wafer exposed in the exposure step, an etching step of removing a region other than the resist image developed in the developing step, and a resist peeling step of removing the resist.

By repeating the above-described steps, a multilayered circuit pattern can be formed on the wafer. As understood from the foregoing description, at least one exemplary embodiment is directed to a novel and useful technique capable of deforming an optical element and positioning and holding the deformed optical element.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims priority from Japanese Patent Application No. 2005-291295 filed Oct. 4, 2005, which is hereby incorporated by reference herein in its entirety.

What is claimed is:

1. An apparatus for holding an optical element, the apparatus comprising:
   a deformable optical element having an optical surface and backside;
   a holder configured as a base for the apparatus;
   at least one non-contact type force generating actuator configured to deform the optical surface of the optical element, the at least one non-contact type force generating actuator being disposed between the holder and the backside of the optical element,
      wherein the at least one non-contact type force generating actuator is selectively chosen and adapted to attenuate vibration exceeding a predetermined frequency in which the vibration exceeding the predetermined frequency is capable of being transmitted through the apparatus to the optical element;
   a measuring device configured to measure a position of the physical location and overall positioning of the optical element as a whole; and
   at least one displacement causing actuator configured to position the physical location of and overall positioning of the optical element as whole, but not configured to deform the optical surface of the optical element,
      wherein the displacement of the physical location of and overall positioning of the optical element as a whole is based on the measured position,
      wherein the at least one displacement causing actuator is selectively chosen and adapted to attenuate vibration frequency lower than the predetermined frequency in which the vibration having the frequency lower than the predetermined frequency is capable of being transmitted through the apparatus to the optical element.

2. An apparatus according to claim 1, wherein the at least one non-contact type force generating actuator is configured to be feedback controlled based on a force generated by the at least one non-contact type force generating actuator.

3. An apparatus according to claim 1, wherein the at least one non-contact type force generating actuator is controlled so that a drive current for the at least one non-contact type force generating actuator is constant.

4. An apparatus according to claim 1, wherein the at least one non-contact type force generating actuator and the at least one displacement causing actuator are disposed in parallel with each other between the optical element and the holder.

5. An apparatus according to claim 1, further comprising an actuator support plate, wherein the at least one non-contact type force generating actuator and the at least one displacement causing actuator are disposed in series with each other via the support plate, the at least one non-contact type force generating actuator being disposed between the optical element and the support plate, and the at least one displacement causing actuator being disposed between the support plate and the holder.

6. An apparatus according to claim 5, wherein the at least one displacement causing actuator is configured to position the support plate based on a position of the support plate.

7. An exposure apparatus comprising:
   an optical system, wherein the exposure apparatus is configured to expose a substrate to light via the optical system and a reticle; and
   an apparatus for holding an optical element included in the system, the apparatus including,
      a deformable optical element having an optical surface and backside;
      a holder configured as a base for the apparatus;
      at least one non-contact type force generating actuator configured to deform the optical surface of the optical element, the at least one non-contact type force generating actuator being disposed between the holder and the backside of the optical element,
         wherein the at least one non-contact type force generating actuator is selectively chosen and adapted to attenuate vibration exceeding a predetermined frequency in which the vibration exceeding the predetermined frequency is capable of being transmitted through the apparatus to the optical element;
      a measuring device configured to measure a position of the physical location of and overall positioning of the optical element as a whole; and
      at least one displacement causing actuator configured to position the physical location and overall positioning of the optical element as whole, but not configured to deform the optical surface of the optical element,
         wherein the positioning of the physical location of and overall positioning of the optical element as a whole is based on the measured position,
         wherein the at least one displacement causing actuator is selectively chosen and adapted to attenuate vibration having a frequency lower than the predetermined frequency in which the vibration having the frequency lower than the predetermined frequency is capable of being transmitted through the apparatus to the optical element.

8. A method of manufacturing a device utilizing an exposure apparatus including an optical system, wherein the exposure apparatus is configured to expose a substrate to light via the optical system and a reticle; and an apparatus for holding an optical element included in the system, the apparatus including,
   a deformable optical element having an optical surface and backside;

a holder configured as a base for the apparatus;

at least one non-contact type force generating actuator configured to deform the optical surface of the optical element, the at least one non-contact type force generating actuator being disposed between the holder and the backside of the optical element, wherein the at least one non-contact type force generating actuator is selectively chosen and adapted to attenuate vibration exceeding a predetermined frequency in which the vibration exceeding the predetermined frequency is capable of being transmitted through the apparatus to the optical element;

a measuring device configured to measure a position of the physical location of and overall positioning of the optical element as a whole; and at least one displacement causing actuator configured to position the physical location of and overall positioning of the optical element as whole, but not configured to deform the optical surface of the optical element, wherein the positioning of the physical location of and overall positioning of the optical element as a whole is based on the measured position, wherein the at least one displacement causing actuator is selectively chosen and adapted to attenuate vibration having a frequency lower than the predetermined frequency in which the vibration having the frequency lower than the predetermined frequency is capable of being transmitted through the apparatus to the optical element, the method comprising:

exposing a substrate to light using the exposure apparatus;

developing the exposed substrate; and processing the developed substrate to manufacture the device.

\* \* \* \* \*